United States Patent
Yu

(10) Patent No.: US 9,059,352 B2
(45) Date of Patent: *Jun. 16, 2015

(54) SOLAR ENERGY SYSTEMS USING EXTERNAL REFLECTORS

(71) Applicant: Pu Ni Tai Yang Neng (HangZhou) Co., Limited, Hangzhou (CN)

(72) Inventor: Pingrong Yu, Santa Clara, CA (US)

(73) Assignee: PU NI TAI YANG NENG (HANGZHOU) CO., LIMITED, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/911,377

(22) Filed: Jun. 6, 2013

(65) Prior Publication Data

US 2014/0048118 A1 Feb. 20, 2014

Related U.S. Application Data

(63) Continuation of application No. 13/587,758, filed on Aug. 16, 2012, now Pat. No. 8,471,142.

(51) Int. Cl.
| | |
|---|---|
| *H01L 31/042* | (2014.01) |
| *H01L 31/00* | (2006.01) |
| *H01L 31/052* | (2014.01) |
| *H01L 31/0232* | (2014.01) |

(52) U.S. Cl.
CPC ............. *H01L 31/0525* (2013.01); *Y02E 10/52* (2013.01); *H01L 31/02325* (2013.01)

(58) Field of Classification Search
CPC ............. H01L 31/0522; H01L 31/052; H01L 31/0525; H01L 31/02325; H01L 31/0232; Y02E 10/42
USPC .................................................. 136/246, 259
See application file for complete search history.

(56) References Cited

U.S. PATENT DOCUMENTS

| | | |
|---|---|---|
| 4,249,516 A | 2/1981 | Stark |
| 6,689,949 B2 | 2/2004 | Ortabasi |
| 2011/0186108 A1 | 8/2011 | Liu et al. |

FOREIGN PATENT DOCUMENTS

JP        2002198556 A  *  7/2002

OTHER PUBLICATIONS

English translation of JP 2002-198556, p. 1-8. 2002.*
IATSE, Reflectors website, Aug. 28, 2008, http://www.iatse611.org/education/Electrics2.htm.

* cited by examiner

*Primary Examiner* — Jennifer K. Michener
*Assistant Examiner* — Marla D McConnell
(74) *Attorney, Agent, or Firm* — Chen Yoshimura LLP

(57) ABSTRACT

A solar energy concentrating system with high light collection efficiency includes a light concentrating unit, a light homogenizing unit and photovoltaic modules. The light concentrating unit includes a parabolic reflector and an ellipsoidal reflector which are coaxial and confocal. The light homogenizing unit includes an infrared filter and a hollow spherical reflector with a hole in its surface. When the system is under illumination, light is concentrated by the light concentrating unit through the hole in the spherical reflector surface and reflected by the inner surface of the spherical reflector onto the photovoltaic modules. The infrared filter covers the hole in the spherical reflector surface and reduces the heat in the photovoltaic modules under concentrated light. The combination of the parabolic reflector and the ellipsoidal reflector obtain highly concentrated light, and the hollow spherical reflector ensures light uniformity on the photovoltaic modules and light utilization efficiency.

7 Claims, 7 Drawing Sheets

US 9,059,352 B2

SOLAR ENERGY SYSTEMS USING EXTERNAL REFLECTORS

BACKGROUND OF THE INVENTION

1. Field of the Invention

The present invention relates generally to the photovoltaic technology, and more specifically to a solar energy concentrating system based on reflection.

2. Description of the Related Art

With the development of society and technology, more and more energy is demanded. The traditional energy is mostly non-renewable energy which will be exhausted one day. In order to meet the demand of energy and protect environment, innovative energy technology emerges rapidly. As a kind of renewable energy, the application of photovoltaics is limited by low conversion efficiency and high cost. The photovoltaic concentrator system concentrates more light on photovoltaic panels which can improve the conversion efficiency and thus decrease the use of the solar cell materials to obtain the same amount of electricity. As a result, this system can potentially reduce the cost of power generation by photovoltaic panels.

According to the principle of light concentration, photovoltaic concentrator systems can be divided into reflection type concentrator and transmission type concentrator. Furthermore, the reflection type concentrator includes plane mirror reflection and curved mirror reflection while the transmission type concentrator includes Fresnel type concentrator and prism type concentrator.

Light collection efficiency is the most important parameter in a photovoltaic concentrator system. In order to reach high light collection efficiency, the system is required to concentrate more light, distribute light evenly on photovoltaic modules and make photovoltaic modules reflect less light. At present, photovoltaic concentrator systems usually use lens to homogenize the light and keep photovoltaic modules perpendicular to the light to reduce the reflection loss. So, expensive lens and complex light tracking systems are adopted to solve those problems, which are not ideal to cut the cost of a photovoltaic concentrator system.

SUMMARY OF THE INVENTION

The present invention advantageously provides a solar energy concentrating system based on reflection, which can not only solve the problem of radiation uniformity, but also reduce the reflection loss of photovoltaic modules, and thereby improving the light collection efficiency.

In one embodiment, A solar energy concentrating system comprises a light concentrating unit including a parabolic reflector and a ellipsoidal reflector, a light homogenizing unit including a infrared filter and a hollow spherical reflector, and photovoltaic modules. The parabolic reflector and the ellipsoidal reflector are coaxial and confocal. One focal point of the ellipsoidal reflector coincides with the focal point of the parabolic reflector, and the other focal point of the ellipsoidal reflector locates near the plane of the hole in the spherical reflector surface. The hole is covered with the infrared filter used to filter a certain range of infrared light. The photovoltaic modules are arranged on the bottom part of the hollow spherical reflector.

The light collection method of the present invention is that the light is concentrated through twice reflection by the parabolic reflector and the ellipsoidal reflector, then passes the infrared filter into the hollow spherical reflector, and finally illuminates the photovoltaic modules directly and by reflection of the hollow spherical reflector.

In a preferred embodiment, the arrangement of the photovoltaic modules is designed in accordance to calculation the light intensity distribution on the inner surface of the hollow spherical reflector.

In preferred embodiments, flexible photovoltaic modules are arranged on the bottom part of the inner surface of the hollow spherical reflector; rigid photovoltaic modules are arranged on a horizontal plane near the bottom part of the hollow spherical reflector.

In a preferred embodiment, the light homogenizing unit in the system is packaged in a holder with a water cooling system.

In a preferred embodiment, a plurality of solar energy concentrating systems compose an array of solar energy concentrating system.

In a preferred embodiment, an array of solar energy concentrating system is surrounded by plane mirror reflectors to further increase the light concentration In a preferred embodiment, the solar energy concentrating system operates in a combination of light tracking system.

DETAILED DESCRIPTION OF THE PREFERRED EMBODIMENTS

Figure 1:
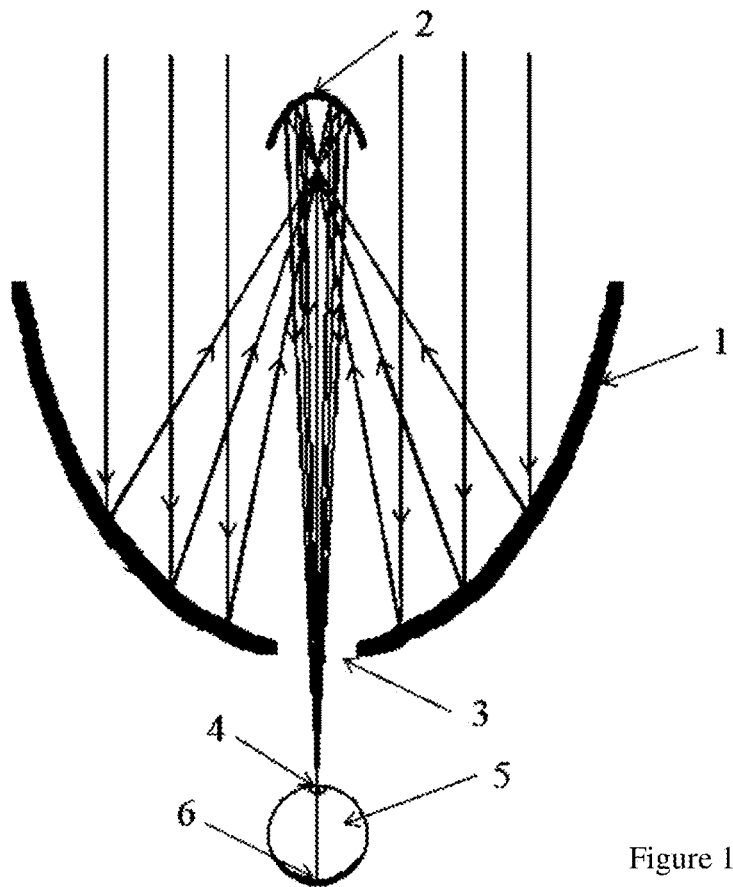
FIG. 1 is a schematic diagram of a solar energy concentrating system according to an embodiment of the present invention.

FIG. 1 is a schematic diagram of a solar energy concentrating system according to an embodiment of the present invention. Preferably, the reflecting surface of the parabolic reflector 1 is coated with metal or ceramic reflective material. The reflecting surface of the ellipsoidal reflector 2 is coated with silver and silica reflective bilayer. The inner surface of the hollow spherical reflector 5 is coated with metal reflective material.

When the system is under illumination, the light firstly reflected and concentrated at the focal point of the parabolic reflector 1 and then reflected and concentrated by the ellipsoidal reflector 2 which is confocal with the parabolic reflectors. After twice reflection, the light passes through the infrared filter 4 and into the hollow spherical reflector 5. A part of light is directly absorbed by the photovoltaic modules 6. The other part of light will be reflected by the inner surface of the hollow spherical reflector and finally absorbed by the photovoltaic modules 6 as well.

Figure 2:
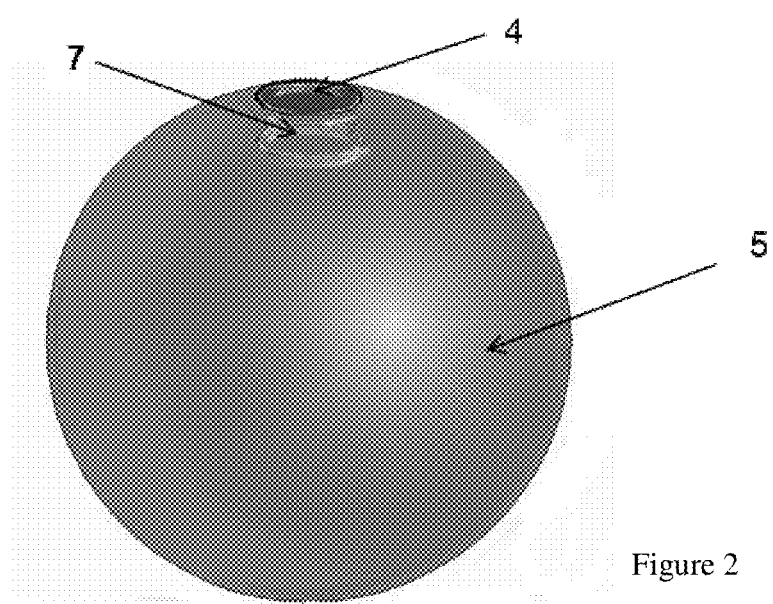
FIG. 2 is a schematic diagram of the light homogenizing unit useful in the embodiment of FIG. 1.

As shown in FIG. 2, the hole in the surface of the hollow spherical reflector 5 is covered with the infrared filter 4 used to filter out a certain range of infrared light. In high concentration condition, the intensity of infrared light is very high, which may make the photovoltaic modules overheated or damaged. So, it is necessary to prevent a certain range of infrared light travelling into the hollow spherical reflector 5. The function of the hollow spherical reflector 5 is to restrict the light in the hollow spherical reflector 5 and reflect as much light as possible onto the photovoltaic modules 6. Even some light reflected by the photovoltaic modules 6 will again reflect back onto the photovoltaic modules 6 by the inner surface of the hollow spherical reflector 5. By this way, the light collection efficiency can be maximized and the efficiency of the system can be enhanced.

Figure 3:
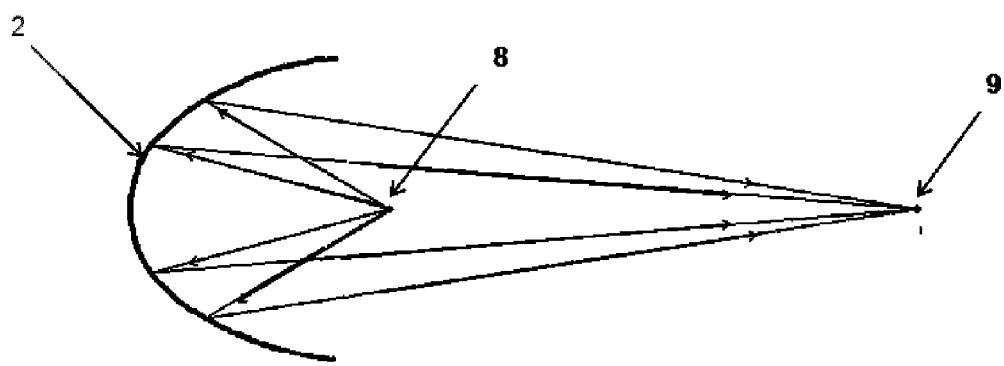
FIG. 3 is a schematic diagram of the ellipsoidal reflector with two focal points useful in the embodiment of FIG. 1.

FIG. 3 shows the schematic diagram of the ellipsoidal reflector 2. The focal point 8 of the ellipsoidal reflector 2 coincides with the focal point of the parabolic reflector 1. The parabolic reflector 1 concentrates the light on the focal point 8. And the light from the focal point 8 is concentrated by the ellipsoidal reflector 2 on the focal point 9 near the hollow spherical reflector 5.

Figure 4:
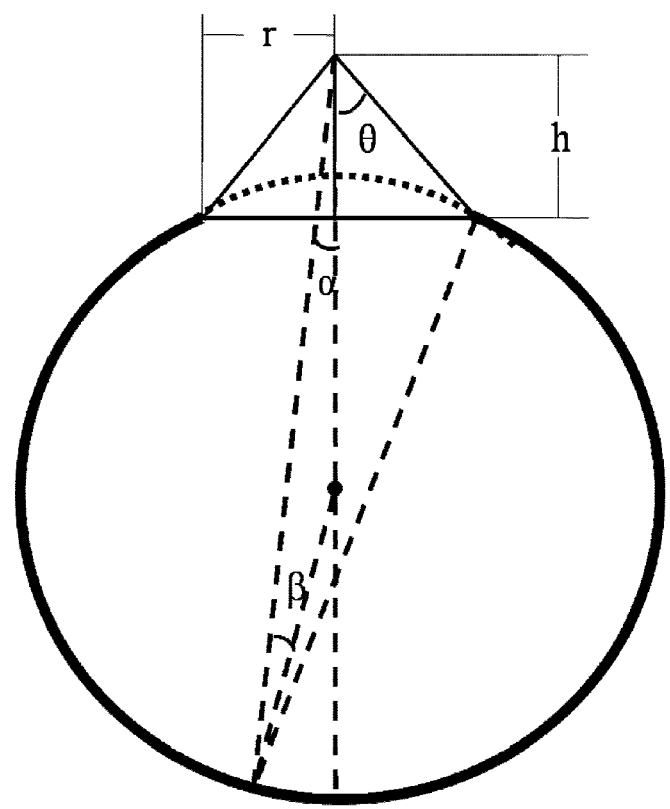
FIG. 4 illustrates the hollow spherical reflector geometry model.

FIG. 4 illustrates the hollow spherical reflector geometry model. When the light passes through the hole of hollow spherical reflector 5 and illustrates the photovoltaic modules, a part of light will reflected out of the hollow spherical reflector 5 though the hole due to the reflection of photovoltaic modules inside the hollow spherical reflector. Preferably, this part light should be less than 4.5% of the total incident light. Generally, the maximum reflectance of CIGS solar cell is around 15%. Thus, the maximum distance from the focal point 9 to the plane of the hole in the surface of the hollow spherical reflector 5 can be calculated.

As shown in FIG. 4, $\alpha$, $\theta$, r, h and R represent the maximum angle where the light can be reflected out of the hole, the maximum angle where the light can go into the hollow spherical reflector 5, the radius of the hole, the distance from the focal point 9 to the plane of the hole, and the radius of the hollow spherical reflector 9, respectively. $\alpha$ can be expressed as below:

$$\alpha = \arctan\left(\frac{R\sin\frac{\arcsin\frac{r}{R}}{3}}{h + \sqrt{R^2 - r^2} + R\cos\frac{\arcsin\frac{r}{R}}{3}}\right)$$

When the hollow spherical reflector 9 is made, r and R are determined. It is required that the reflection loss should be less than 4.5%, $\alpha$ equals 30% of $\theta$. With $$\theta = \arctan(r/h),$$

h and $\theta$ can be expressed as below:

$$h \leq \left(\frac{0.279d\left(\sqrt{r^2 + d^2} + r\cos\frac{\arcsin\frac{d}{r}}{3}\right)}{r\sin\frac{\arcsin\frac{d}{r}}{3} - 0.279d}\right)$$

$$\theta \geq \arctan\left(\frac{dr\sin\frac{\arcsin\frac{d}{r}}{3} - 0.279d^2}{0.279d\left(\sqrt{r^2 + d^2} + r\cos\frac{\arcsin\frac{d}{r}}{3}\right)}\right)$$

When the value of h is taken as maximum, the value of $\theta$ reaches minimum correspondingly. At this time, the system can make use of the smallest area of the photovoltaic modules to reach optimum efficiency and cost.

Figure 5:
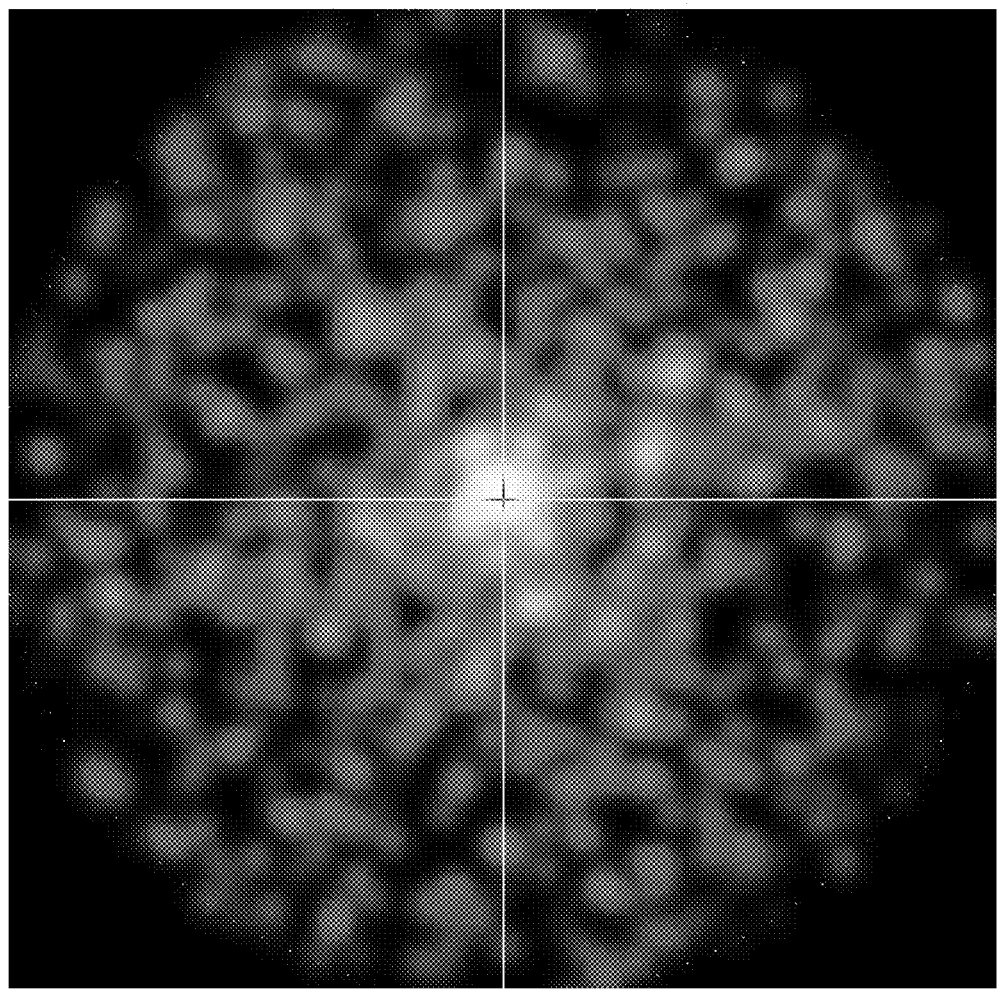
FIG. 5 illustrates the intensity distribution on the inner surface of the hollow spherical reflector when the value of $\theta$ is taken as minimum.

For a reflector with metallic coating, reflection loss is around 30%. Since the requirement of reflection loss is less than 4.5%, the light intensity after eight-time reflection attenuates to 3.946% and can be neglected here. Therefore, seven-time reflection is considered in the simulation of light intensity distribution. FIG. 5 shows the intensity distribution on the inner surface of the hollow spherical reflector when the value of $\theta$ is taken as the minimum. The photovoltaic modules can be arranged in the central area ($0.114\pi R$) where the light intensity is relative high in order to reach the optimum light collection efficiency.

Figure 6:
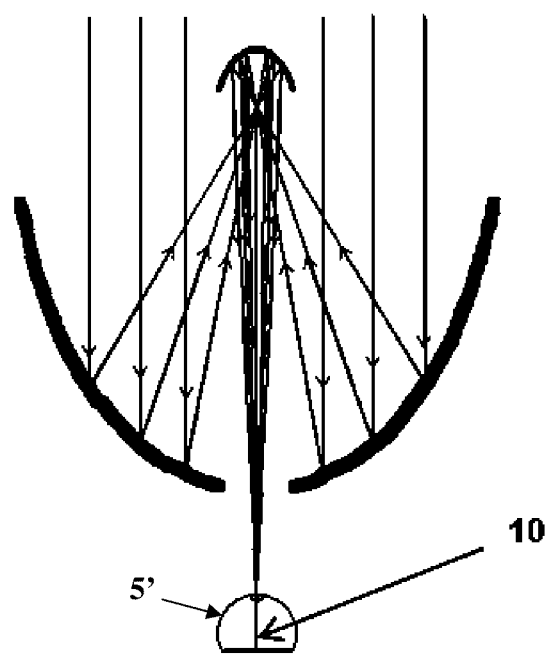
FIG. 6 is a schematic diagram of another embodiment of the present invention for use with rigid photovoltaic modules.

FIG. 6 shows a solar energy concentrating system according to another preferred embodiment. This system is similar to that of the embodiment of FIG. 1, except for the shape of the hollow spherical reflector 5'. For flat and rigid photovoltaic modules, the bottom section of the hollow spherical reflector 5' can be removed. The rigid photovoltaic modules 10 can be placed on a horizontal plane near the bottom part (e.g. spherical cap radius of ⅓R) of the hollow spherical reflector 5'.

Figure 7:
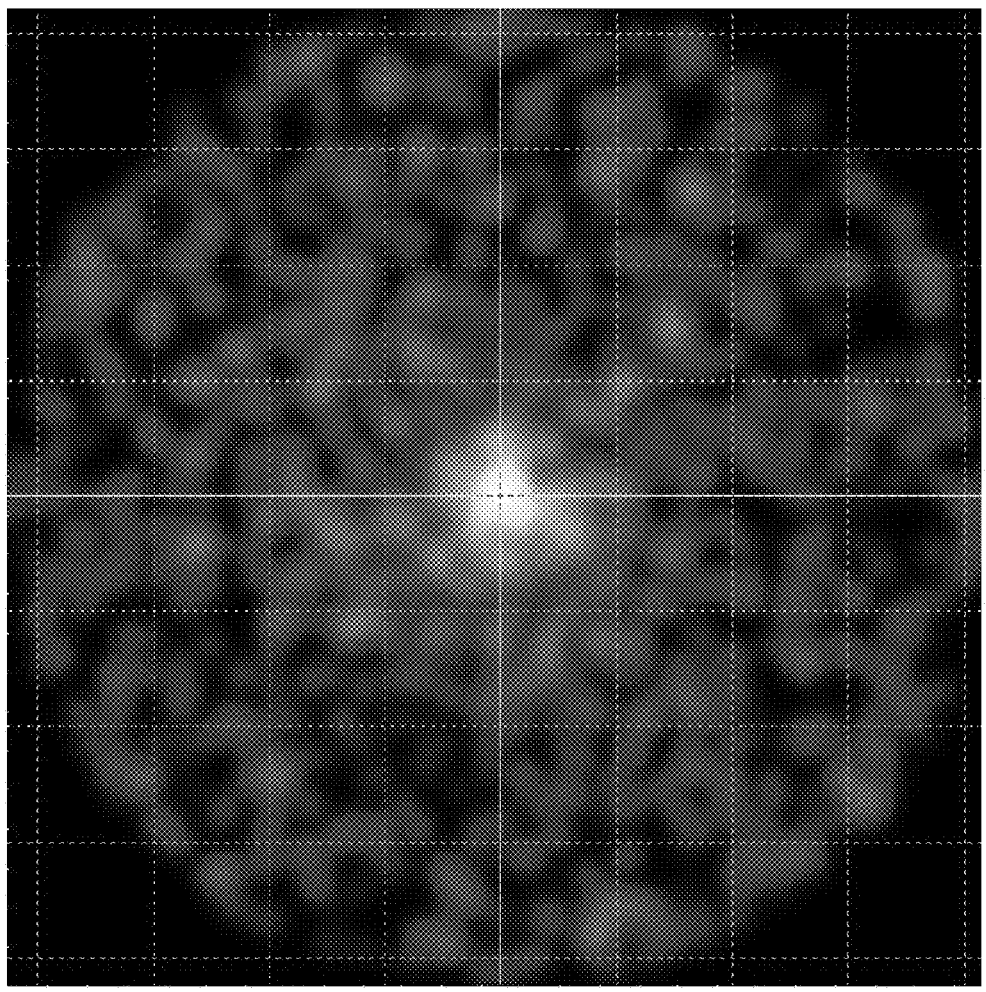
FIG. 7 illustrates the light intensity distribution on the horizontal plane of the bottom part of the hollow spherical reflector.

FIG. 7 shows the optimal scheme of the light path simulation results of intensity distribution on the plane where the photovoltaic modules 10 are placed. The photovoltaic modules are arranged in its center area.

Figure 8:
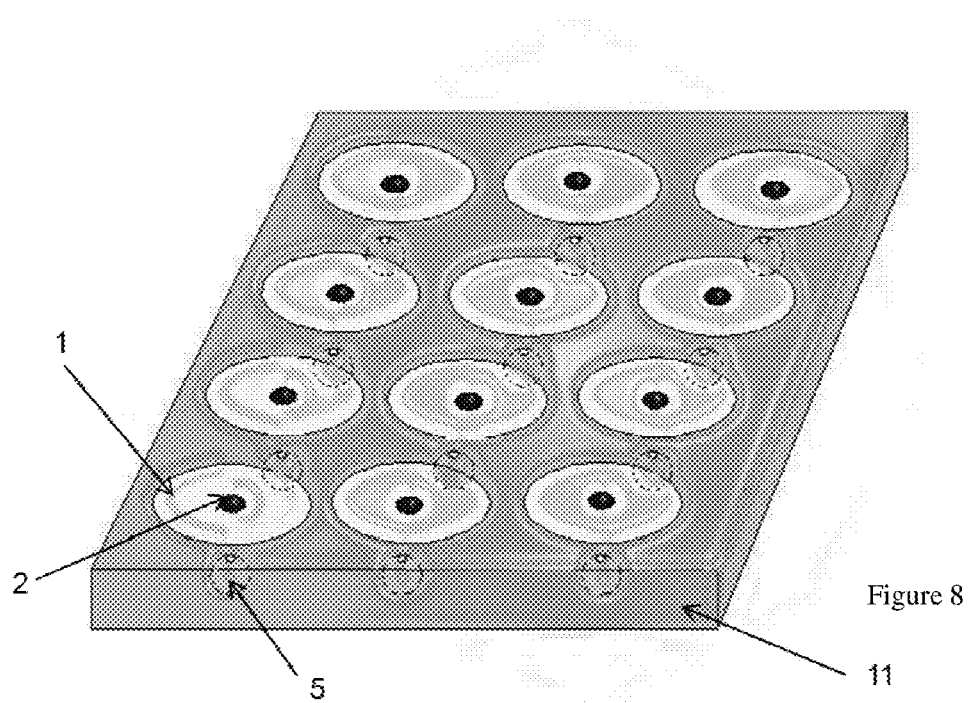
FIG. 8 is a schematic diagram of an array of the solar energy concentrating system of FIG. 1 or FIG. 6 packaged in cubic holders with water cooling system.
Figure 9:
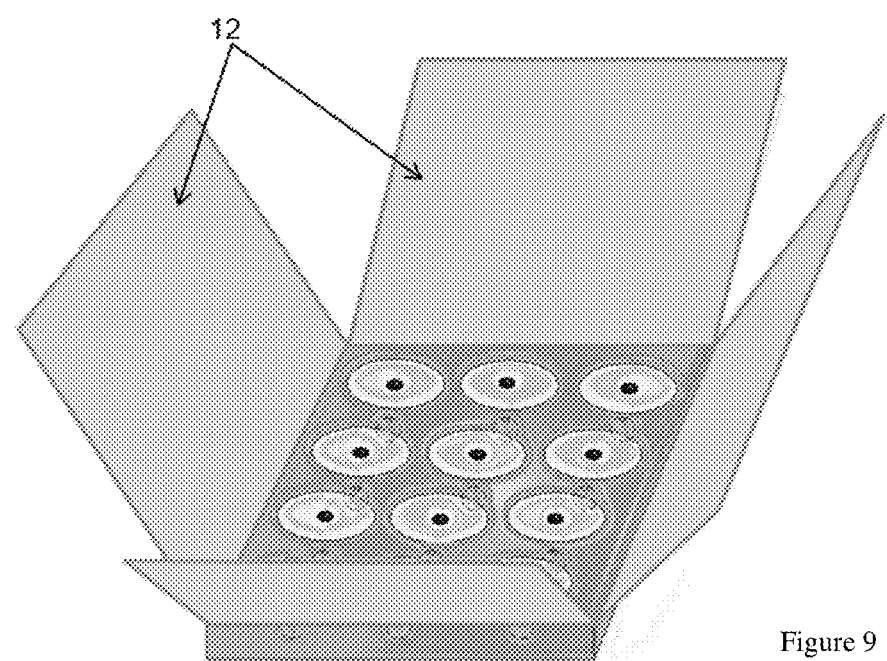
FIG. 9 is a schematic diagram of an array of the solar energy concentrating system of FIG. 8 surround by plane mirror reflectors.

FIGS. 8 and 9 illustrate arrays of the solar energy concentrating system of FIG. 1 or FIG. 6. The homogenizing unit including the infrared filter 4 and the hollow spherical reflector 5 is packaged in the cubic holder 11 with water cooling system. FIG. 9 is an array of the solar energy concentrating system surrounded by plane mirror reflector 12, where an improvement is made based on the system shown in FIG. 8.

Figure 10:
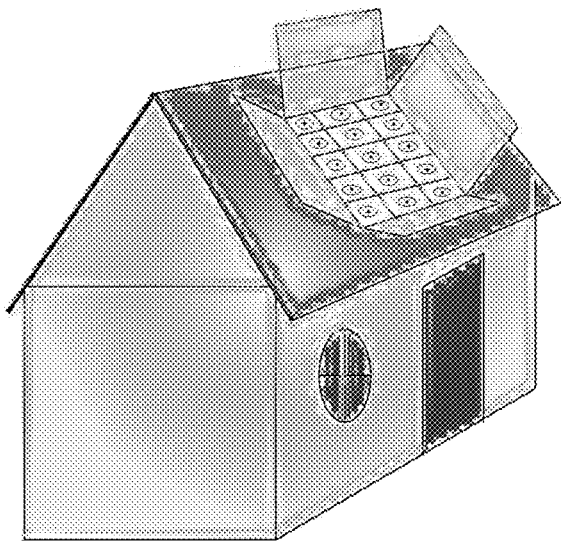
FIG. 10 illustrates a first application of embodiments of the present invention.
Figure 11:
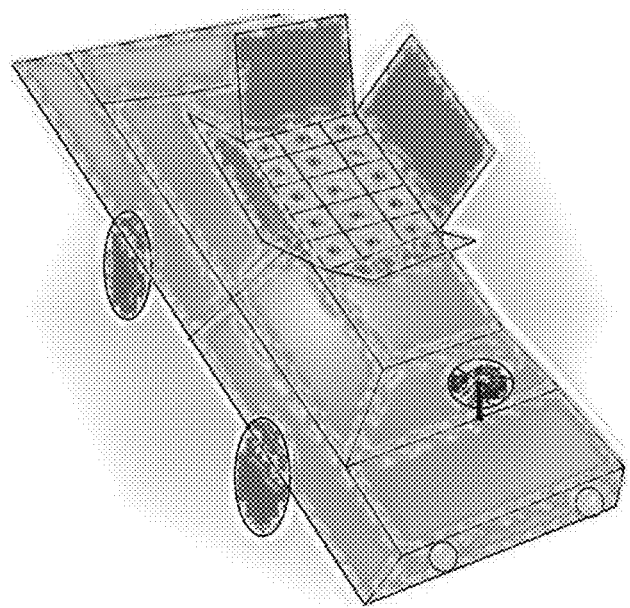
FIG. 11 illustrates a second application of embodiments of the present invention.

FIGS. 10 and 11 are two possible practical applications of the present invention. The solar energy concentrating system can be put on the roof of a house or a car to generate power.

What is claimed is:

1. A solar energy concentrating system comprising:
    (1) a light concentrating unit;
    (2) a light homogenizing unit including a hollow spherical reflector, wherein the hollow spherical reflector has a hole, wherein the light concentrating unit is disposed to focus solar light to a convergence point which is located in line with the hole, in line with the center of the hollow spherical reflector, and outside of the hollow spherical reflector, wherein the hollow spherical reflector is disposed to pass the light from the light concentrating unit through the hole into an inside of the hollow spherical reflector; and
    (3) one or more photovoltaic modules disposed inside the hollow spherical reflector for absorbing light.

2. The solar energy concentrating system of claim 1, wherein the light concentrating unit includes a parabolic reflector and an ellipsoidal reflector.

3. The solar energy concentrating system of claim 1, wherein the light homogenizing unit further includes an infrared filter disposed to cover the hole of the hollow spherical reflector.

4. The solar energy concentrating system of claim 2, wherein the parabolic reflector and the ellipsoidal reflector are coaxial and confocal.

5. The solar energy concentrating system of claim 3, wherein the infrared filter filters out a range of infrared light.

6. The solar energy concentrating system of claim 1, wherein an inner surface of the hollow spherical reflector is coated with a reflective material.

7. The solar energy concentrating system of claim 1, wherein the photovoltaic modules are arranged on a bottom part of the hollow spherical reflector.

* * * * *